United States Patent [19]

Glenn

(10) Patent No.: US 6,657,298 B1
(45) Date of Patent: Dec. 2, 2003

(54) INTEGRATED CIRCUIT CHIP PACKAGE HAVING AN INTERNAL LEAD

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/909,160

(22) Filed: Jul. 18, 2001

(51) Int. Cl.[7] .................. H01L 23/04; H01L 23/48; H01L 23/52
(52) U.S. Cl. .................. 257/730; 257/666; 257/690; 257/692; 257/678; 257/784; 257/787; 361/772
(58) Field of Search .................. 257/666, 668, 257/692, 687, 730, 784, 787, 678, 690; 361/772

(56) References Cited

U.S. PATENT DOCUMENTS 5,273,938 A  * 12/1993  Lin et al. ............... 437/207
5,646,829 A  *  7/1997  Sota ....................... 361/813
5,729,437 A  *  3/1998  Hashimoto ............. 361/760
5,831,332 A    11/1998  Sono et al. .............. 257/696
5,999,413 A  * 12/1999  Ohuchi et al. .......... 361/772
6,093,584 A  *  7/2000  Fjelstad ................... 438/127

* cited by examiner

Primary Examiner—Tom Thomas
Assistant Examiner—Nitin Parekh
(74) Attorney, Agent, or Firm—Bever, Hoffman & Harms, LLP; James E. Parsons

(57) ABSTRACT

A package for an integrated circuit chip is disclosed, along with structures and methods for making and mounting the package. An exemplary embodiment of the package includes a molded body having leads embedded therein with an aperture adjacent each of the leads. A portion of each lead that is internal to the periphery of the package body is exposed through the corresponding aperture. Electrical connection to the leads is made within the respective corresponding apertures.

33 Claims, 11 Drawing Sheets

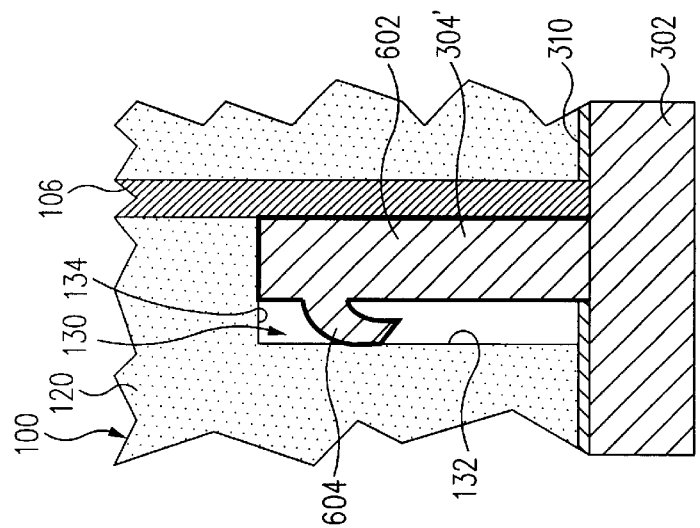
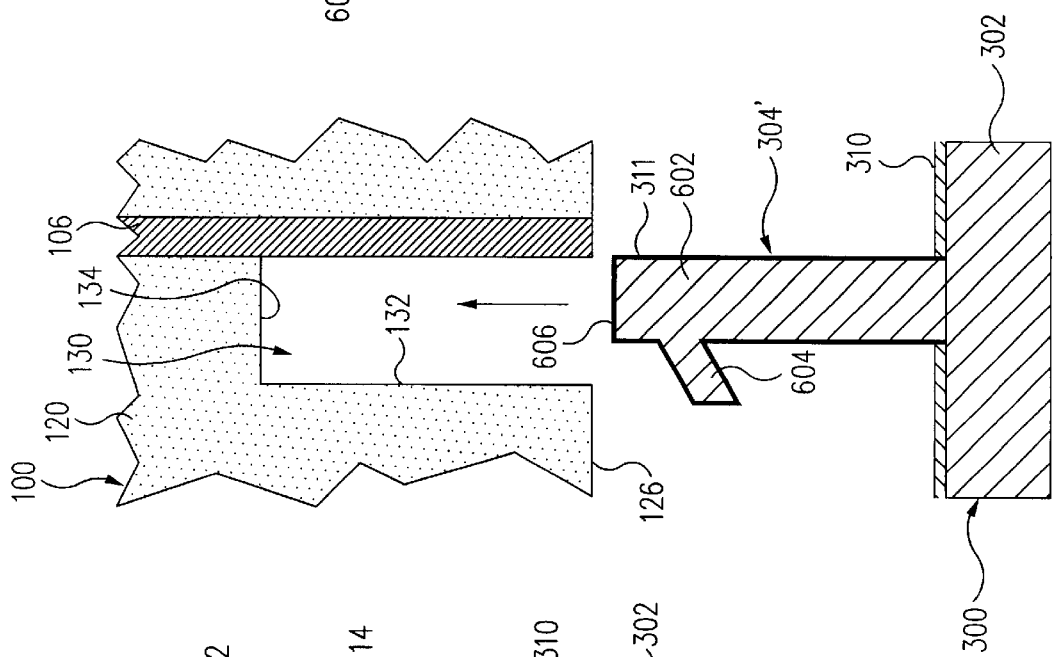
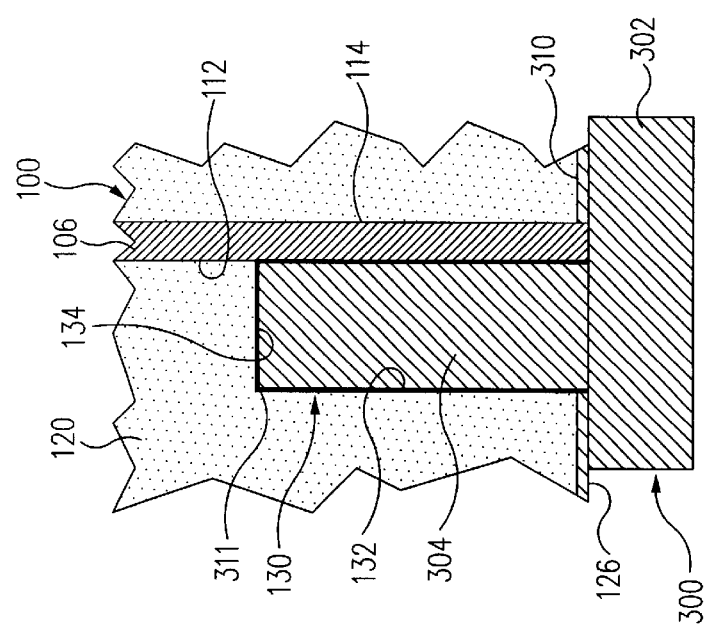

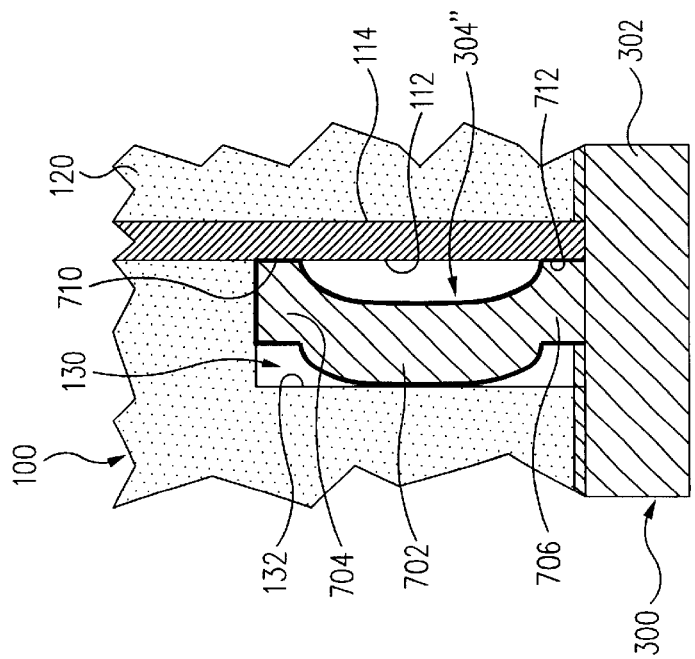

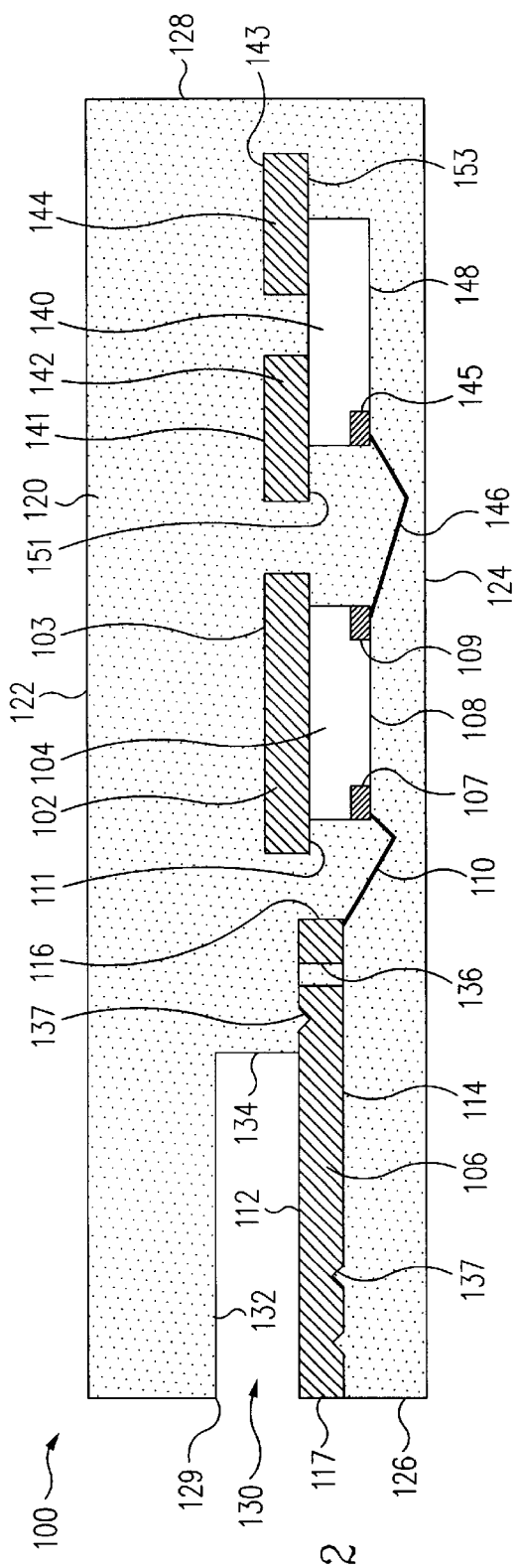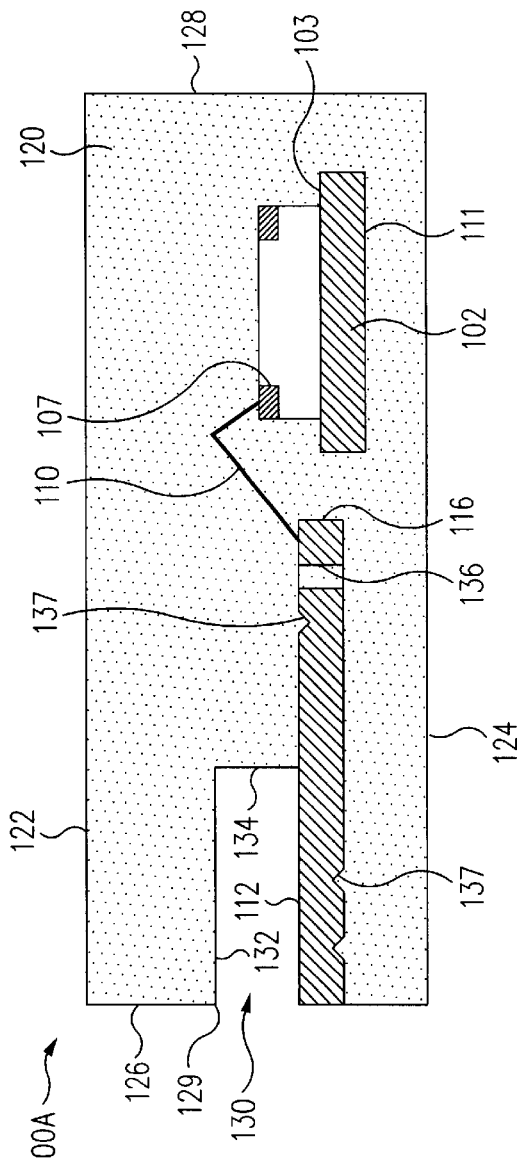

INTEGRATED CIRCUIT CHIP PACKAGE HAVING AN INTERNAL LEAD

TECHNICAL FIELD

The present invention relates to a package for an integrated circuit chip and a method for fabricating such a package.

DESCRIPTION OF THE RELATED ART

Integrated circuit chip packages may have a leadframe substrate or a laminate substrate. The chip is mounted on the substrate, and is electrically connected to input/output terminals of the substrate. Examples of such packages include dual-in-line or quad leadframe packages, and ball grid array packages. Such packages are mounted to a motherboard by soldering the input/output terminals of the package substrate to traces on the mounting surface of the motherboard. The packages are typically mounted so that the substrate and chip are essentially parallel to the mounting surface.

Drawbacks of such conventional designs include a relatively large footprint of the package on the mounting surface of motherboard. The footprint reflects what is typically the maximum dimension of the package, namely, the x-y area of the package. In applications where mounting space is at a premium, such a pagers, portable telephones, and personal computers, among others, a large footprint is undesirable. Another drawback is that the packages are fused by solder to the motherboard. This makes removal of the package from the motherboard difficult, if not impossible.

SUMMARY

The present invention includes, among other things, embodiments of integrated circuit packages. An exemplary package includes a molded plastic body having an integrated circuit chip disposed therein. A set of leads is electrically coupled to the integrated circuit chip. Each of the leads is at least partially embedded within the molded plastic body. An aperture is formed in the molded plastic body adjacent an embedded portion of a surface of the leads. At least a portion of each lead is exposed through the corresponding aperture to permit electrical connection to the lead through the aperture and within the peripheral sides of the package body.

Such a package may be coupled to external circuitry by a mounting substrate having conductive pins extending therefrom. In an exemplary embodiment, the package may be physically mounted and electrically coupled to external circuitry by inserting the conductive pins of the substrate into the apertures formed in the integrated circuit package. Contact between the respective pins and the exposed lead surface within the respective apertures provides a snug, electrically conductive connection between the package and the mounting substrate. Optionally, multiple integrated circuit packages may be similarly mounted on corresponding sets of pins extending from the substrate body.

These and other aspects of the present invention will become more apparent upon a reading of the following description of exemplary embodiments, in conjunction with the drawings thereof.

BRIEF DESCRIPTION OF THE DRAWINGS

FIG. 5 is a cross-sectional breakaway side view of a FIG. 1 package mounted on a substrate.

FIGS. 6A and 6B are cross-sectional breakaway side views of a FIG. 1 package being mounted on a substrate.

FIGS. 7A and 7B are a cross-sectional breakaway side views of a FIG. 1 package being mounted on a substrate.

FIG. 12 is a cross-sectional side view of a package including a pair of integrated circuit chips.

FIG. 14 is a cross-sectional side view of a package including an integrated circuit chip.

In the drawings, similar features of the various embodiments typically have the same reference numerals.

DETAILED DESCRIPTION

Figure 1:
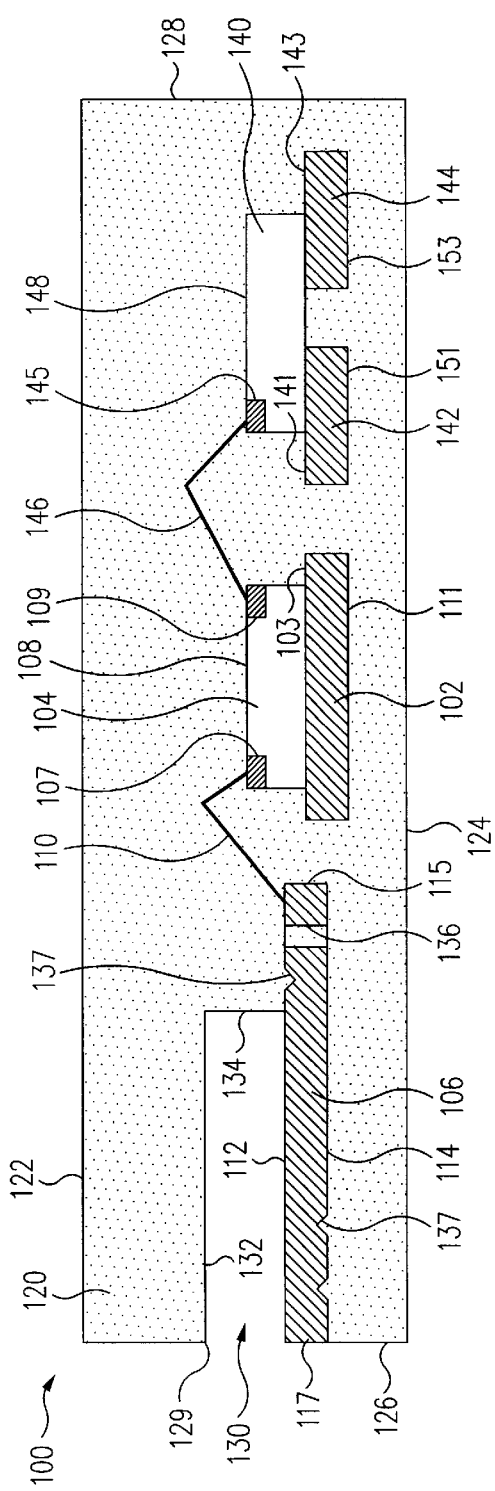
FIG. 1 is a cross-sectional side view of a package including a pair of integrated circuit chips.

FIG. 1 is a cross-sectional side view of a package 100 in accordance with one embodiment of the present invention. The package 100 includes an integrated circuit chip 104 that is mounted on a planar first surface 103 of a die pad 102. The die pad 102 may be formed of metal, which is copper in this example. The integrated circuit chip 104 may comprise any type of integrated circuit chip (e.g., a memory chip, logic chip, or processor chip). Typically, the inactive surface of the integrated circuit chip 104 is attached to the adjacent surface 103 of the die pad 102 by a layer of adhesive, e.g., an insulative epoxy-based adhesive film.

A plurality of metal leads 106 are provided to couple the integrated circuit chip 104 with circuitry (not shown) external to the package 100, (e.g., a motherboard). Each lead 106 includes opposing planar first and second surfaces 112 and 114, respectively. The first surface 112 of each lead 106 is electrically coupled to one of a plurality of conductive bond pads 107 on the active surface 108 of the integrated circuit chip 104 by at least one conductive element 110. The plurality of conductive elements 110 in this example are bond wires, but the manner of electrically connecting the leads 106 to the integrated circuit chip 104 can vary. For instance, the configuration of leads 106 can be changed so that the integrated circuit chip 104 connects to the leads 106 in a flip chip arrangement that omits the die pad 102 and uses reflowed solder balls as the conductive elements 110 (see FIG. 17).

The die pad 102, the integrated circuit chip 104, the conductive elements 110, and the leads 106 are in within a molded body 120. The body 120 may be formed of a plastic encapsulant material adapted to insulate and protect the encapsulated structures from the environment. In one embodiment, the encapsulant may be Hysol ® 4450 or 4423 encapsulants from the Dexter Hysol Company of City of Industry, Calif. or some other conventional molding encapsulant. In one embodiment, the body 120 has a rectangular prism shape having a planar first surface 122, and an opposite planar second surface 124, and planar side surfaces 126, 128, 219, and 221 between the first and second surfaces 122 and 124. The body 120 includes a plurality of open bores, called apertures 130 herein, that extend into the body 120 through the side surface 126.

Each aperture 130 is formed in the body 120 adjacent the first surface 112 of a corresponding lead 106. At least a portion of the first surface 112 of the lead 106 internal to all of the peripheral surfaces of the body 120 is exposed through the aperture 130 to permit electrical connection to the first surface 112 of the lead 106 through the corresponding aperture 130. Each aperture 130 has an opening 129 on the side surface 126 of the body 120, and is generally defined by the exposed first surface 112 of the lead 106, longitudinal wall 132, and end wall 134.

The side surface 126 of the body 120 is substantially orthogonal to and intersects the internal wall 132 of the aperture 130 along the opening 129. The aperture 130 may be substantially cylindrical along the longitudinal wall 132 and the end wall 134 may be substantially planar. A longitudinal axis of the aperture 130 is generally parallel with the first surface 112 of the lead 106 and orthogonal to the side surface 126.

In one embodiment, the aperture 130 is tapered at an angle of less than about 5° and, according to a particular embodiment, at an angle of about 1–3°, such that the sectional area of the aperture 130 along the length of wall 134 is slightly less than the sectional area defined by the aperture opening 129 and the first surface 112 of the lead 106. Tapering the aperture 130 as described may facilitate removal of mold apparatus from the aperture 130 during molding. In some applications, a tapered aperture may also be beneficial in maintaining a conductive pin of a mounting substrate within the aperture 130 by furthering an interference fit between the tapered wall 132 of the aperture 130 and the pin disposed within the aperture 130. Details regarding this interference fit and an example molding process are described below.

As mentioned, an outer portion of the first surface 112 of the lead 106 is exposed to the aperture 130 and an inner portion of the first surface 112 of the lead 106 is encapsulated (i.e., covered with the plastic molded encapsulant material) within the body 120. The outer portion of the first surface 112 of the lead 106 that is exposed to the open aperture 130 can be contacted by a pin of the mounting substrate that is inserted within aperture 130, thereby making an electrical connection between the pin and the integrated circuit chip 104 through the aperture 130, lead 106, and conductive element 110. The portion of the first surface 112 of the lead 106 that is encapsulated (i.e., covered) within the body 120 helps secure and maintain the lead 106 within the body 120. The conductive element 110 is illustrated as being coupled to the encapsulated inner portion of the first surface 112 of the lead 106.

In the embodiment of FIG. 1, the aperture 130 has a depth into the body 120 that is approximately two-thirds of the length of the adjacent lead 106. The inner end 116 of the lead 106 extends beyond the end wall 134 and, hence, is fully encapsulated where the conductive element 110 connects to the first surface 112 of the lead 106. The depth of the aperture 130 varies to accommodate the mounting substrate. A deeper aperture 10 typically provides a stronger connection of the package 100 to pins of a mounting substrate or the like.

In the embodiment of FIG. 1, the lead 106 is internal to the body 120 with no portion of the lead 106 extending beyond the outer surfaces of the body 120. The second surface 114, longitudinal side surfaces 115 (FIG. 13), and the inner end surface 116 of the lead 106 are illustrated as being entirely encapsulated in the body 120. A flat severed proximal end surface 117 of the lead 106 is exposed in and is coplanar (i.e., flush) with the plane of side surface 126 of body 120. Of course, the outer portion of the first surface 112 of the lead 106 is exposed within aperture 130. Alternatively, depending, for example, on the method used to sever the leads 106 from a lead frame used to make package 100, a very short stub (not shown) of the lead 106 may extend beyond the side surface 126.

Accordingly, the package 100 may be electrically coupled to external circuitry (not shown) by inserting a conductive pin (see FIG. 3) into the aperture 130 for electrical connection to the exposed portion of the first surface 112 of the lead 106. Such pins also may serve to physically connect the package 100 to a printed circuit board or other mounting structure.

To enhance an adhesive connection between the leads 106 and the body 120, the leads 106 may be provided with anchoring features, such as a hole 136 through lead 106 between first and second surfaces 112, 114, and/or grooves 137 in first and/or second surfaces 112, 114. Such anchoring features fill with encapsulant material during molding. Protruding ears 155 (see FIG. 13) may also extend from the longitudinal side surface 115 of the leads 106 into the encapsulant material. The hole 136, the grooves 137, and the ears 155 generally function to lock the leads 106 within the body 120. The grooves 137 may also prevent moisture from entering the body 120 along the lead 106.

Alternatively, or additionally, the peripheral longitudinal sides 115 and the end surface 116 of the leads 106 may be provided with a profile that enhances their connection to the encapsulant material of the body 120. Examples of such profiles may include the cross-sectional shapes illustrated in FIGS. 9–11.

Figure 9:
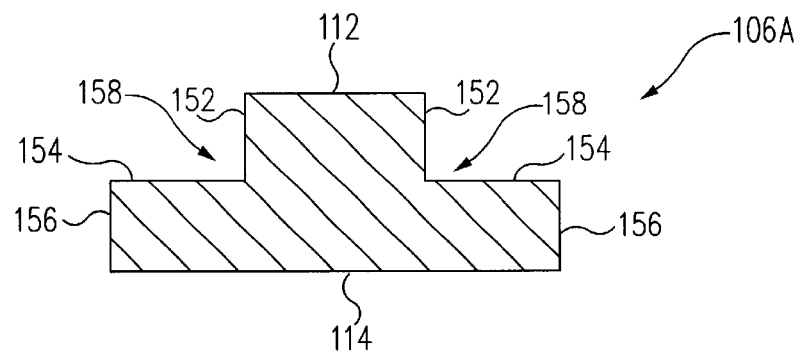
FIG. 9 is a cross-sectional view of another embodiment of a FIG. 1 lead.

FIG. 9 is a cross-sectional view of a lead 106A, which has a substantially symmetrical cross-section that is substantially shaped like an inverted "T", or more generally has a lip at second surface 114. The lead 106A has opposing. first and second surfaces 112 and 114. A first set of opposing side surfaces 152 are parallel to each other and perpendicularly intersect the first surface 112 of the lead 106 at opposite sides thereof. A set of transverse surfaces 154 are parallel with the first and second surfaces 112 and 114 and intersect the first set of opposing side surfaces 152 opposite the first surface 112. A second set of opposing side surfaces 156 are parallel with the first set of opposing side surfaces 152 and extend between and intersect the transverse surfaces 154 and the second surface 114. The first set of opposing side surfaces 152 and the transverse surfaces 154 define recessed regions 158 into which molten encapsulant may flow during the molding process. After hardening, the encapsulant disposed within the recessed regions and over transverse surfaces 154 aids in securely maintaining the lead 106A within the body 120. The recessed regions 158 may be formed using techniques such as half-etching, stamping, coining, or the like.

Figure 10:
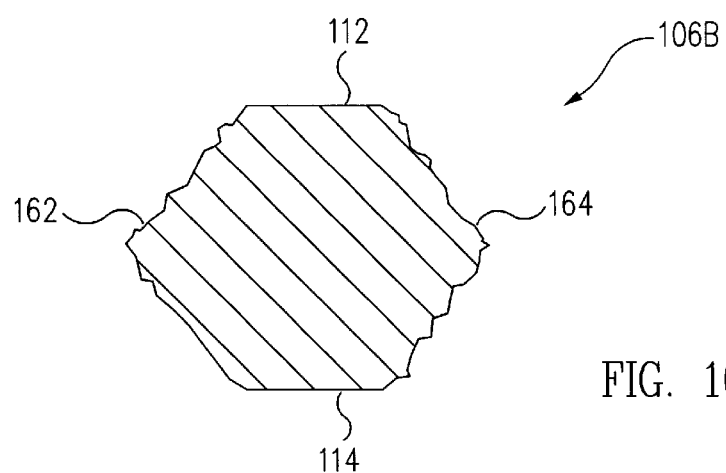
FIG. 10 is a cross-sectional view of another embodiment of a FIG. 1 lead.

FIG. 10 is a cross-sectional view of an alternative lead 106B, which is substantially symmetrical. The lead 106B has opposing first and second surfaces 112 and 114 and opposing convex side surfaces 162 and 164 that include numerous asperities. The convex side surfaces 162 and 164 intersect and extend between the first and second surfaces 112 and 114. The convex surfaces 162 and 164 and asperities may be formed in the lead 106B during an etching process used to form the leadframe (FIG. 13) by under etching the lead 106B. During the molding process, molten encapsulant flows over the convex side surfaces 162 and 164 and over the asperities. After hardening, the convex side surfaces 162 and 164 and asperities extend into the encapsulant material aid in securely maintaining the lead 106B securely within the body 120.

Figure 11:
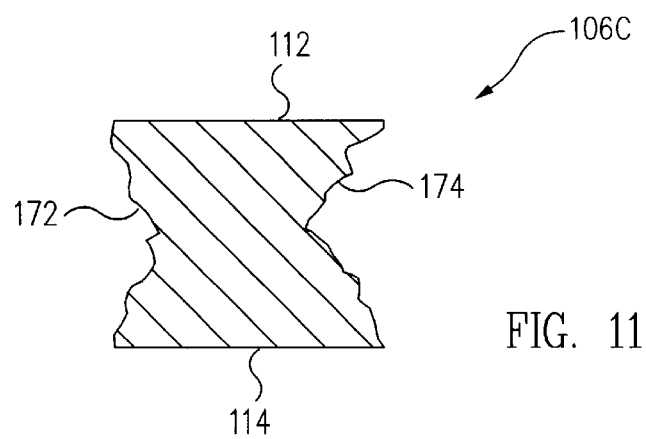
FIG. 11 is a cross-sectional view of another embodiment of a FIG. 1 lead.

FIG. 11 is a cross-sectional view of a lead 106C, which is substantially symmetrical. The lead 106C has opposing first and second surfaces 112 and 114 and opposing concave side surfaces 172 and 174 that include numerous asperities. The concave side surfaces 172 and 174 intersect and extend between the first and second Surfaces 112 and 114. The concave side surfaces 172 and 174 may be formed in the lead 106C during an etching process used to make the leadframe by over etching the lead 106C, which may result in the rough, concave side surfaces 172 and 174 illustrated in FIG. 11. During the molding process, molten encapsulant flows into the concave side surfaces 172 and 174. After hardening, the concave side surfaces 172 and 174 and asperities fill with encapsulant material and aid in securely maintaining the lead 106C securely within the body 120.

Referring back to FIG. 1, an optional, additional, integrated circuit chip 140 may also be disposed within the body 120, so as to form a module. The integrated circuit chip 140 is mounted on first surfaces 141 and 143 of pads 142 and 144, respectively and is electrically coupled to the integrated circuit chip 104 by at least one conductive element 146. The conductive element 146 electrically connects a conductive bond pad 145 of the active surface 148 of the integrated circuit chip 140 with a conductive bond pad 109 of the active surface 108 of the integrated circuit chip 104. Typically, a plurality of conductive elements 146 will be used to respectively electrically connect respective bond pads 145, 109.

Of course, the integrated circuit chip 140 may be replaced with other types of electric components, such as resistors, capacitors, and inductors, among other possibilities.

Figure 2:
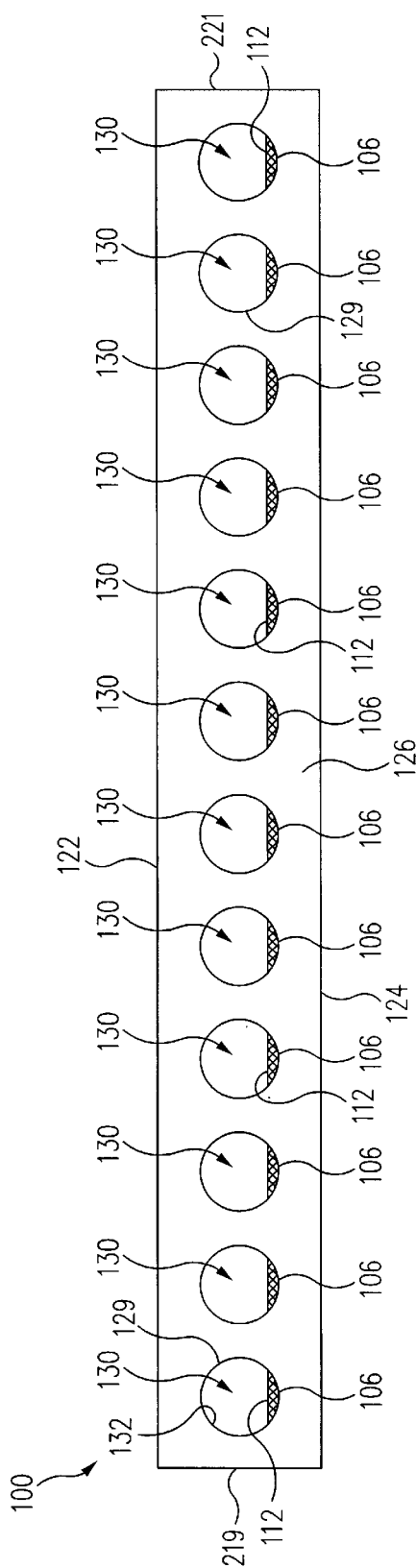
FIG. 2 is side view of the FIG. 1 package.

FIG. 2 is side view of the package 100 of FIG. 1. FIG. 2 illustrates the package 100 as having a plurality of apertures 130 formed in the body 120 through the surface 126, each corresponding to one of the twelve leads 106. Those skilled in the art will appreciate that different types of integrated circuit chips may use different numbers of leads and the number of apertures formed in the body may vary to correspond with the number of leads of the integrated circuit or other components disposed within the body 120. The apertures 130 are formed in a single row, aligned in side-by-side fashion, and may be substantially centrally located between the first and second surfaces 122 and 124 and between side surfaces 219 and 221.

As illustrated in FIG. 2, each of the apertures 130 may have a cross-sectional shape that is substantially circular with a flat bottom portion. The internal aperture wall 132 may define the substantially circular portion and a first surface 112 of a lead 106 may define the flat bottom portion.

Figure 3:
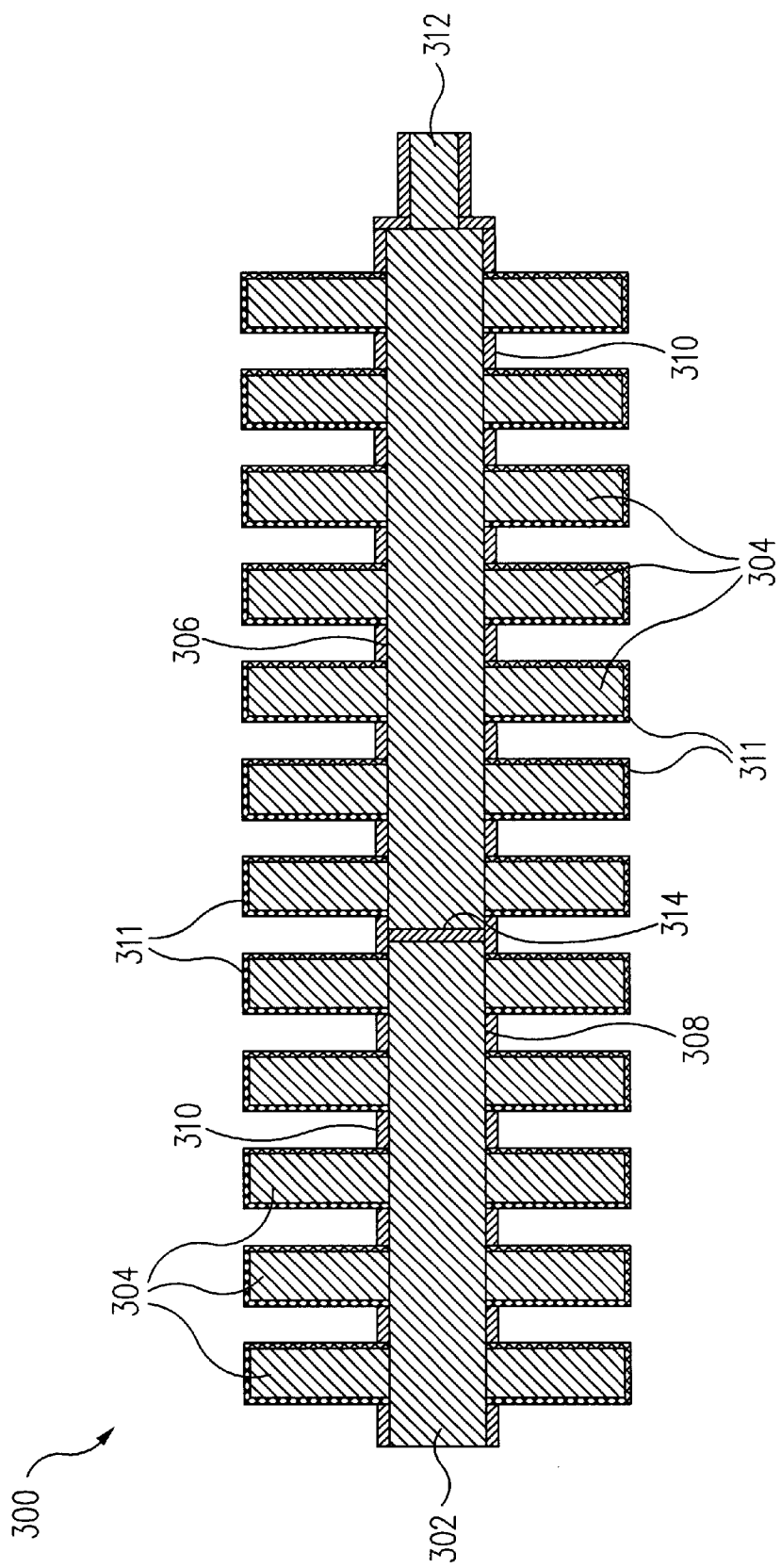
FIG. 3 is a cross-sectional side view of a mounting substrate.

FIG. 3 is a cross-sectional side view of a mounting substrate 300 that may be used for-mounting one or more of the inventive packages, such as the package 100 described above, to external circuitry (not shown). The substrate 300 is generally formed of an elongated substrate body 302 including integral substantially cylindrical pins 304 extending perpendicularly therefrom. The substrate body 302 has a first side 306 with a set of pins 304 extending perpendicularly therefrom and an opposite second side 308 with a set of pins 304 extending perpendicularly therefrom.

In one embodiment, the substrate body 302 is a molded plastic unit (injection or transfer molding) with conductive traces 310 provided on exterior surfaces thereof. The pins 304 extend integrally from body 302 and include a conductive coating 311 disposed on all or a subportion of the plastic exterior surface. In FIG. 3, conductive coating 311 covers the entire pin, but alternatively may be over only the portion of the pin 304 that is intended to contact first surface 112 of leads 106 of the package 100 mounted on substrate 300.

The conductive traces 310 and the conductive coating 311 of substrate 300 may be copper that is plated on the molded plastic substrate body 302 and pins 304 using an electrodeless plating process. Of course, other metals than copper (e.g., aluminum or silver) may be used. The copper-coated pins 304 may have an outer layer of gold, nickel, or other metal plating to facilitate electrical connectivity to the leads 106 of FIG. 1. Conductive ink or a metal-filled epoxy also can be used for the traces 310 and the conductive coating 311. Alternatively, or additionally, the pins 304 may have a layer of solder disposed on an exterior surface thereof for later permanent connection with the leads 106 by using reflow soldering techniques.

The conductive coating 311 disposed on each of the pins 304 is electrically coupled with the conductive traces 310 to permit electrical connectivity between the pins 304 and the traces 310. Some or all of the traces 310 may be electrically connected to metal terminals of an edge connector 312 at an end of the substrate body 302. The edge connector 312 may be inserted into an interconnection receptacle (not shown) on a motherboard or in an electronic chassis. Other traces 310 may electrically connect one group of pins 304 on side 306 to another group of pins 304 on side 306, so that packages 100 (FIG. 1) mounted on separate groups of pins 304 on the same side of the substrate body 302 may be electrically interconnected. Further, one or more conductive vias 314 may extend through the substrate body 302 so as to electrically connect one or more traces 310 on opposing sides 306, 308 of the substrate body 302. Accordingly, packages 100 mounted on opposite sides 306, 308 of the substrate body 302 may be electrically interconnected through the substrate body 302 by the vias 314 connected between respective traces 310 on opposing sides 306, 308. The traces 310 and the vias 314 may be formed of metals, such as copper or aluminum, or may be conductive ink or a metal-filled epoxy.

Accordingly, as discussed in more detail below, integrated circuit packages 100 may be mounted on the pins 304 of the substrate 300 and electrically connected to external circuitry through the connector 312. This may be accomplished by inserting the pins 304 into the apertures 130 (FIG. 2), to snugly mount the package 100 to the substrate 300 and to make a contact between the leads 106 and conductive coating 311 of the pins 304, which in turn are electrically connected to the traces 310.

Figure 4:
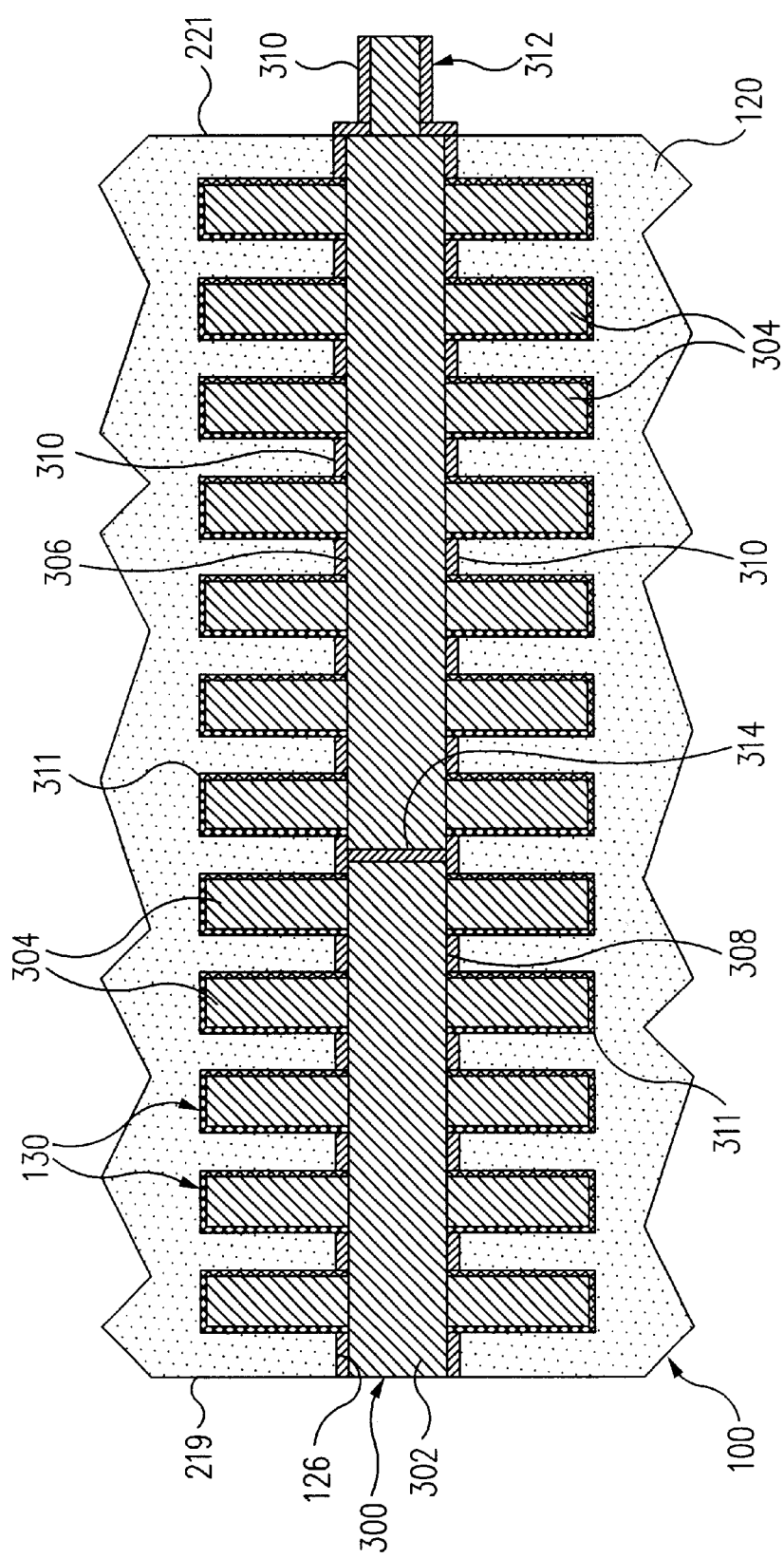
FIG. 4 is a cross-sectional side breakaway view of a pair of FIG. 1 packages mounted on the FIG. 3 substrate.

FIG. 4 illustrates a breakaway cross-sectional side view of a pair of the integrated circuit packages 100 (FIGS. 1 and 2) mounted on the substrate 300 (FIG. 3). A first package 100 is mounted on a first set of pins 304 on the first side 306 of the mounting substrate 300, and a second package 100 is mounted on a second set of pins 306 on the opposite second side 308 of the mounting substrate 300.

In one embodiment discussed above, the pins 304 are coated with solder. After insertion of the pins 304 into the corresponding package apertures 130 of the package 100, the metal coating 311 of the pins 304 may be soldered to the exposed outer portion of the first surface 112 of the corresponding leads 106 (FIG. 2) that are exposed through the corresponding apertures 130. Solder that is pre-applied on the conductive coating 111 or on the exposed first surface 112 of the lead 106 is melted and then solidified to connect the conductive coating 311 of the pin 304 to the lead 106. Reflow soldering the pins 304 to the leads 106 within the apertures 130 provides a permanent (absent breakage or melting) electrical connection between each of the pins 304 and the associated leads 106.

In another embodiment, the pins 304 may be disposed in the corresponding apertures 130 by an interference fit to ensure a snug, albeit non-permanent, electrical connection between the conductive coating 311 of the pin 106 and the exposed first surface 112 of the corresponding lead 106. Examples of such a manner of securing the pins 304 within the corresponding apertures 130 are illustrated in FIG. 5 and discussed below.

Optionally, the pins 304 may comprise resilient members that at least partially deform as the pins 304 enter the corresponding apertures 130 of the package 100. This partial deformation permits the pins 304 to be secured within the corresponding apertures 130 in a stressed condition to provide a snug, non-permanent electrical connection between the conductive coating 311 of the pin 304 and the first surface 112 of the corresponding lead 106. Examples of such a manner of securing the pins 304 within the corresponding apertures 130 are illustrated in FIGS. 6A, 6B, 7A, and 7B and discussed below.

Thus, the leads 106 (FIG. 2) of an integrated circuit package 100 may be electrically coupled and mounted via the pins 304, the traces 310, and the connector 312 of the substrate 300 to circuitry (e.g., a motherboard) external to the package 100. The number of packages that may be mounted on and electrically connected to each other and to external circuitry by the substrate 300 will vary with, for example, the number of pins 304 and the area of opposing sides 306, 308. Of course, in an alternate embodiment, the substrate 300 may have pins 304 only on one of the sides 306, 308.

FIG. 5 is a cross-sectional breakaway side view of a portion of an integrated circuit package 100 mounted on a substrate 300. Only one pin 304 and one lead 106 of the substrate 300 and package 100, respectively, are shown. In this embodiment, the pin 304 is secured within the package aperture 130 by an interference fit. Thus, at least one cross-sectional unstressed dimension of the aperture 130 is smaller than a corresponding dimension of the pin 304. In this configuration, when the pin 304 is inserted into the aperture 130 by force, the encapsulant material of the body 120 surrounding the aperture 130 may be at least partially stressed and the shape of the aperture 130 may be at least partially altered by the pin 304. Inserting the pin 304 into the aperture 130 in this manner maintains the pin 304 tightly within the aperture 130 and in tight electrical contact with the first surface 112 of the lead 106.

In one embodiment, the pin 304 has a different cross-sectional shape from the aperture 130. That is, the pin 304 may have a rectangular cross-sectional shape and the internal wall 132 of the aperture 130 may have the substantially cylindrical shape shown in FIG. 2. In another embodiment, the pin 304 has a cross-sectional shape that is larger than the unstressed cross-sectional shape of the aperture 130 to permit an interference fit of the pin 304 within the aperture 130.

In embodiments where the aperture 130 is tapered, an interference fit may be achieved by inserting the pin 304 by force into the tapered aperture where the cross-sectional dimension of the aperture wall 134 is smaller than a corresponding cross-sectional dimension of the pin 304. Pursuant to this embodiment, the tightness of the interference fit of the pin 304 within the aperture 130 may increase with the depth of the pin 304 within the aperture 130. That is, distal portions of the pin 304 positioned in deeper, and thus narrower, portions of the tapered aperture 130 will have a tighter interference fit than proximal portions of the pin 304 where the pin 304 has a uniform cross-sectional shape and size.

Alternatively, the pins of substrate 300 may be provided with a resilient bending portion adapted to press a portion of the conductive coating 311 of the pin against the exposed first surface 112 within aperture 130. FIGS. 6A and 6B illustrate an example of such an embodiment. Here, a pin 304' for insertion into the aperture 130 of the integrated circuit package 100 comprises a post member 602 and a flap-like spring member 604 extending from the post member 602. The spring member 604 extends from the post member at about a 45° angle, although other angles may also be employed. In the unstressed state shown in FIG. 6A, the pin 304' has major horizontal dimension that is greater than that of the aperture 130 due, at least in part, to the unstressed spring member 604 extending from the post member 602.

When the pin 304' is inserted into the aperture 130, the spring member 602 is stressed and is deformed. As the pin 304' is inserted into the aperture 130, the spring member 604 bends due to pressure from the aperture inside wall 132. The spring member 604 is shown in FIG. 6B as being bent and in a stressed state or condition. In the stressed state shown in FIG. 6B, the spring member 604 exerts a force against the inside wall 132, thus pushing the post member 602 into tight contact with the first surface 112 of the lead 106 to provide a satisfactory and effective electrical connection thereto. The distal end 606 of the pin 304' may or may not contact the aperture end wall 134. The orientation of the pin 304' within the aperture 130 may alternatively be such that the spring member 604 contacts the first surface 112 of the lead 106, provided that the spring member 604 has conductive coating thereon.

FIGS. 7A and 7B illustrate another alternate embodiment including pin 304" for insertion into the aperture 130 of the integrated circuit package 100. The pin 304" comprises a curved member extending from the substrate base 302. The shaft of pin 304" is shown as being generally C-shaped, but may alternatively be S-shaped, or otherwise curved. The pin 304" has an overall unstressed horizontal dimension greater than a minimum width of the aperture 130 so that the pin 304" is at least partially deformed, or compressed, as the pin 304" enters the aperture 130. When the pin 304" is inserted into the aperture 130, the internal wall 132 and the first surface 112 of the lead 106 generally compress the pin 304" and cause the pin 304" to enter a compressed, or stressed, state. In this compressed, or stressed, state, the curved pin 304" exerts force against the internal wall 132 and the first surface 112 of the lead 106. In addition, the pin 304" may be at least partially elongated as the pin 304" enters the aperture 130.

In the unstressed state shown in FIG. 7A, the pin 304" has an overall unstressed horizontal dimension that is greater than a minimum width of the aperture 130 due to the curve of the pin 304. The overall unstressed horizontal dimension includes, at least in part, a curved portion 702, which is illustrated as being disposed between top and bottom straight portions 704 and 706. The overall unstressed horizontal dimension is the horizontal distance between the external apex 708 of the curved portion 702 and the side surface 710 or 712 of the straight portions 704 and 706, whichever is greater.

As the pin 304" is inserted into the aperture 130, the curved portion 702 bends and elongates due to pressure from the inside wall 132 of the aperture 130. The curved portion 702 is shown in FIG. 7B as being bent and in a stressed state or condition. In the stressed state shown in FIG. 7B, the curved portion 702 exerts a force against the inside wall 132, thus pushing the conductive coating 311 on the surfaces 710 and 712 of the straight portions 704 and 706, respectively, into tight contact with the first surface 112 of the lead 106. This configuration provides a snug, but removable, electrical connection between the coating 311 disposed on the pin 304" and the first surface 112 of the lead 106. The distal end 711 of the pin 304" may or may not contact the aperture internal wall 134. The orientation of the pin 304" may alternatively be such that the curved portion of the pin 702 contacts the first surface 112 of the lead 106.

Figure 13:
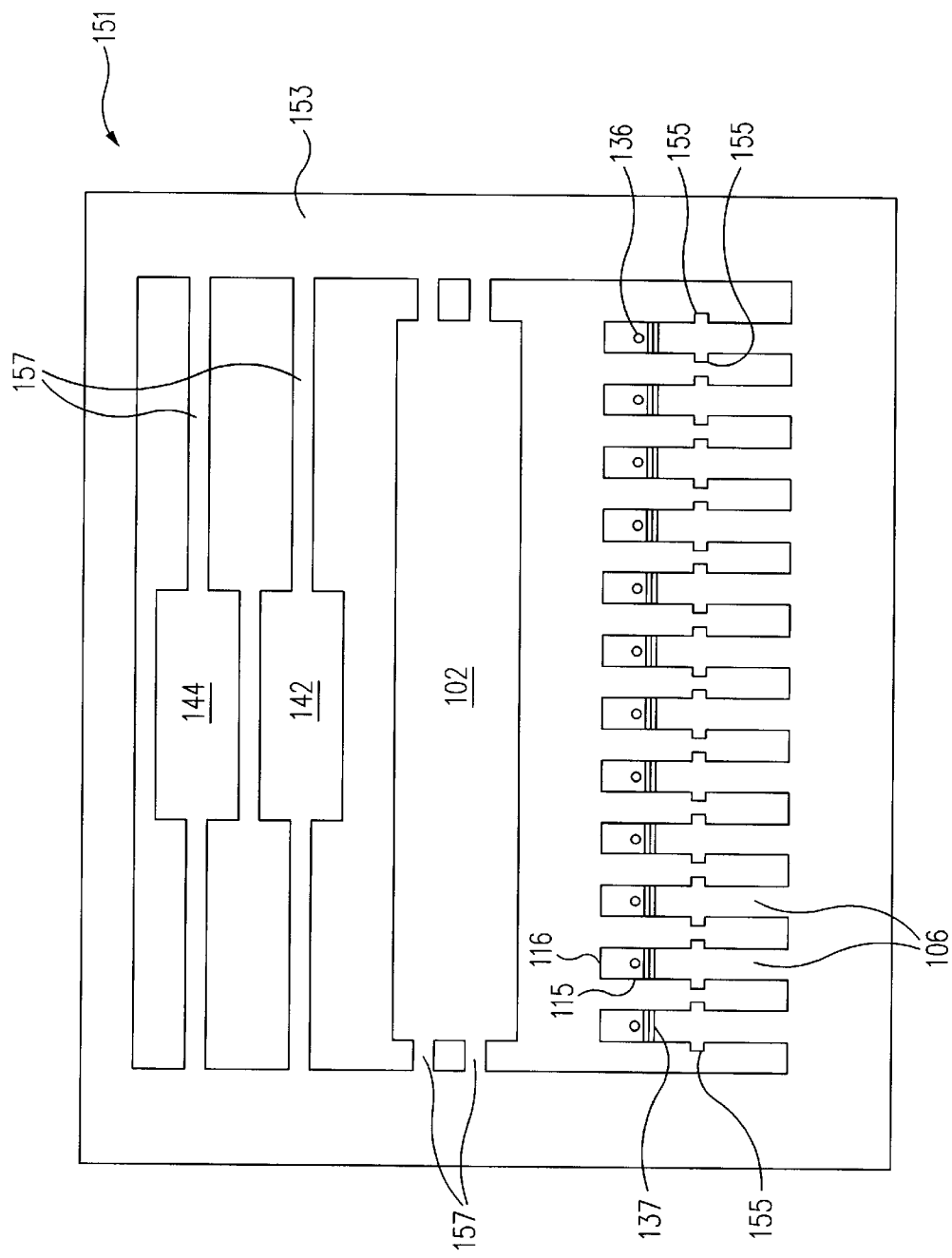
FIG. 13 is a top view of a leadframe.

One embodiment of a method of making package 100 of FIG. 1 uses a metal (e.g., copper, Alloy 42) leadframe. An exemplary leadframe 151 is shown in FIG. 13. Leadframe 151 includes a closed rectangular frame 153 that functions as a dam bar during molding. Leads 106 and die pads 102, 142, and 144 are within and integrally connected to frame 153. Leads 106 extend integrally from one side of the frame 153. The die pads 102, 142, and 144 are supported on opposing sides by tie bars 157 that extend integrally from the other sides of the frame 153. The opposed longitudinal sides 115 of leads 106 may include protruding anchor ears 155. The ears 155 aid in securing the leads 106 within the package 100 after molding. A through hole 136 and grooves 137 also may be formed in leads 106.

Figure 8:
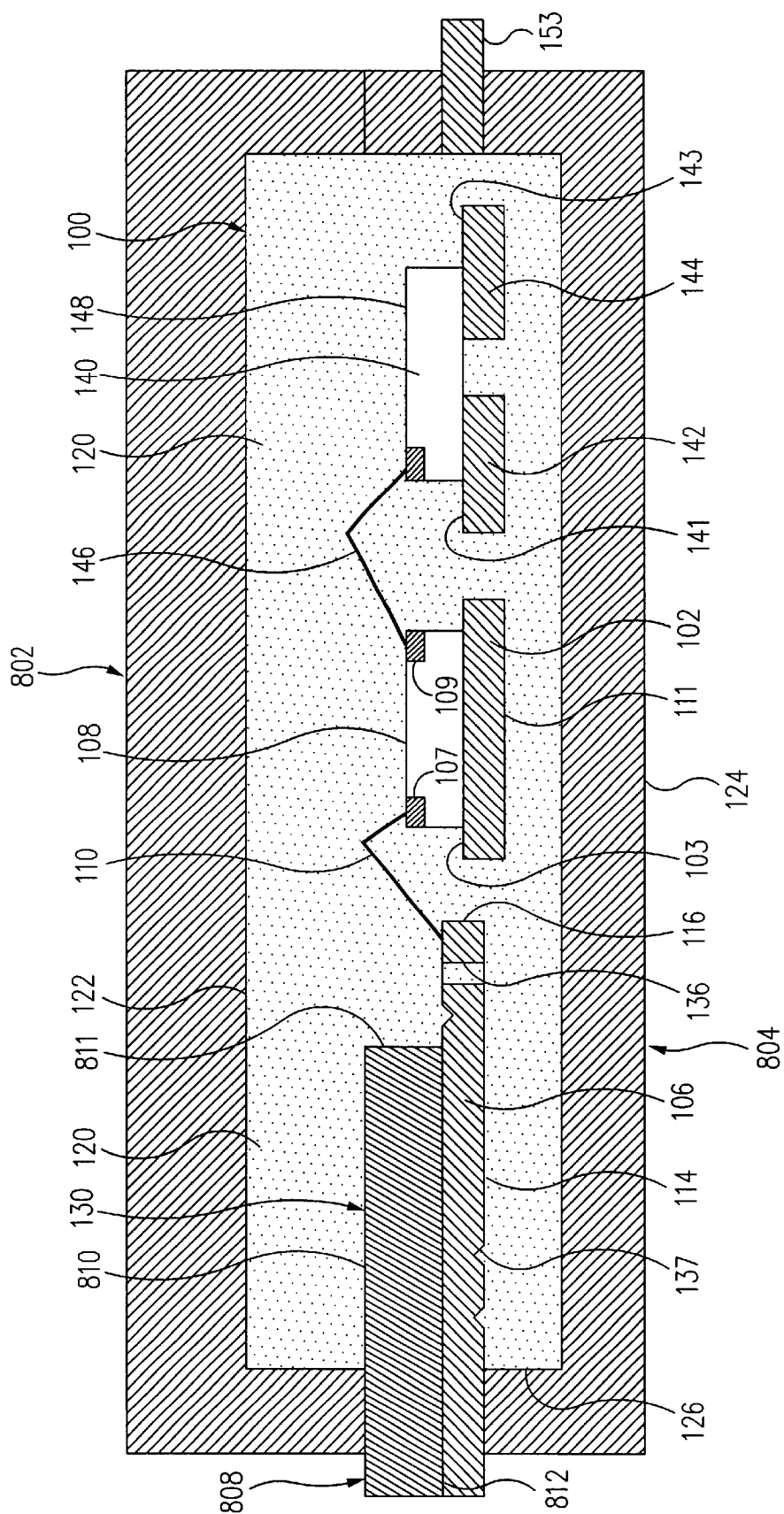
FIG. 8 is a cross-sectional side view of a FIG. 1 package in a molding apparatus.

With reference to FIG. 8, the integrated circuit chip 104 is mounted on the die pad 102 with an epoxy adhesive (not shown), adhesive tape, or other conventional integrated circuit mounting materials. The integrated circuit chip 104 is then electrically connected with the leads 106 by interposing each conductive element 110 between the inner end portion of first surface 112 of the lead 106 and a respective one of the bond pads 107 of the active surface 108 of the integrated circuit chip 104.

Optionally, the second integrated circuit chip 140 may be mounted on the die pads 142 and 144 by an adhesive material (not shown). In this embodiment, the bond pads 145 of the second integrated circuit chip 140 are each electrically connected to the bond pads 109 of the integrated circuit chip 104 by respective ones of the conductive elements 146

The plastic molded body 120 is next molded within the frame 153 and over the integrated circuits 104 and 140, the die pads 102, 142, and 144, the longitudinal side surfaces 115, the inner end surface 116, the entire second surface 114, and the inner end portion of first surface 112 of the leads 106 to encapsulate these components. The molding may be accomplished using plastic transfer or injection molding techniques and conventional encapsulants. The conductive element 110 may be coupled to the first surface 112 of the lead 106 at the encapsulated inner end portion of first surface 112. The outer end portion of the first surface 112 of the leads 106 is not covered, but rather is exposed by the apertures 130 in the body 120. The body 120 generally protects and insulates the encapsulated components from the environment and maintains the encapsulated components in a unitary package.

In one embodiment, the molding process uses a three-piece mold. Referring to FIGS. 1, 2 and 8, a first mold member 802 of mold 800 molds the top surface 122 of the body 120 and a second mold member 804 molds the bottom surface 124 of the body 120. The side surfaces 126, 128, 219, and 221 of the. body 120 may be formed in part by both the first and second mold members 802 and 804.

A third mold member 808 for forming apertures 130 comprises a plurality of elongated members 809 each having a cross-section identical to the desired cross-section of the aperture 130 (see FIGS. 1 and 2). The elongated member 809 may comprise a longitudinal curved portion 810 corresponding to the wall 132 of the aperture 130, an inner end portion 811 corresponding to the end wall 134 (FIG. 1), and a flat portion 812 corresponding with the first surface 112 of the lead 106. In one embodiment, the elongated members 809 may be tapered at an angle less than about 5°, and in a particular embodiment at an angle of about 1–3°, which may, among other things, facilitate removal of the third mold member 808 from the molded body 120.

The flat portion 812 of the elongated members 809 is positioned adjacent an outer portion of the first surface 112 of the respective lead 106. The flat portion 812 and the first surface 112 of the lead 106 are forced together during molding to prevent encapsulant material from entering between the respective elongated members 809 and the outer portion of the first surface 112 of the leads 106 during the molding process. Accordingly, the outer portion of the first surface 112 of the leads 106 is not covered by the encapsulant material.

Those skilled in the art will appreciate that the third mold member 808 may comprise a number of elongated members 809 corresponding to the number of leads 106 of the package being molded. For the package 100 described above and shown in FIGS. 1 and 2, the third mold member 808 may comprise twelve elongated members 809, each being disposed adjacent one of the leads 106.

After mold 800 is closed onto frame 153 of leadframe 151 (FIG. 13), molten encapsulant material then enters the mold and encapsulates the accessible components disposed within the frame 153 of the lead frame 151 to form the body 120. After the encapsulant material has at least partially hardened, the first, second, and third mold members 802, 804, and 808 are removed to form the body 120 of the integrated circuit package 100 as shown in FIGS. 1 and 2. Thus, the apertures 130 for exposing the internal portion of first surface 112 of the lead 106 for an electrical connection thereto may be formed in the molded body 120 during the molding step using a three piece mold.

Next, portions of leadframe 151 that extend beyond the side surface 126 of the body 120 are severed, such as by punching or sawing, so that the severed outer end surface 117 (FIG. 1) of the of the lead 106 is coplanar with the side surface 126, or so that only a small severed stub of the lead 106 extends beyond side surface 126.

In one method of making the package, a plurality of packages 100 may be made in a parallel process using a strip of joined leadframes 151. After all of the packages are assembled through the steps of chip attach and electrical connection between the chip and the leads, the leadframes of the strip may be individually molded, or molded gang style into a single block of encapsulant, and then severed from the undesired portions of the leadframe 151 (e.g., frame 153). In the case of a plurality of leadframes encapsulated into a single block of encapsulant, a saw may be used to saw through the leads 106 and the encapsulant material to singulate the respective packages. Such a sawing step would form a side surface 126 of body 120 that is flush with outer end surface 117 of lead 106.

While the embodiments above form apertures 130 during a molding step, an alternative embodiment uses a two piece mold to form a rectangular prism body 120, and then drills apertures 130 adjacent to first surface 112 of leads 106 to expose the outer portion of the first surface 112 of the leads 106.

Figure 15:
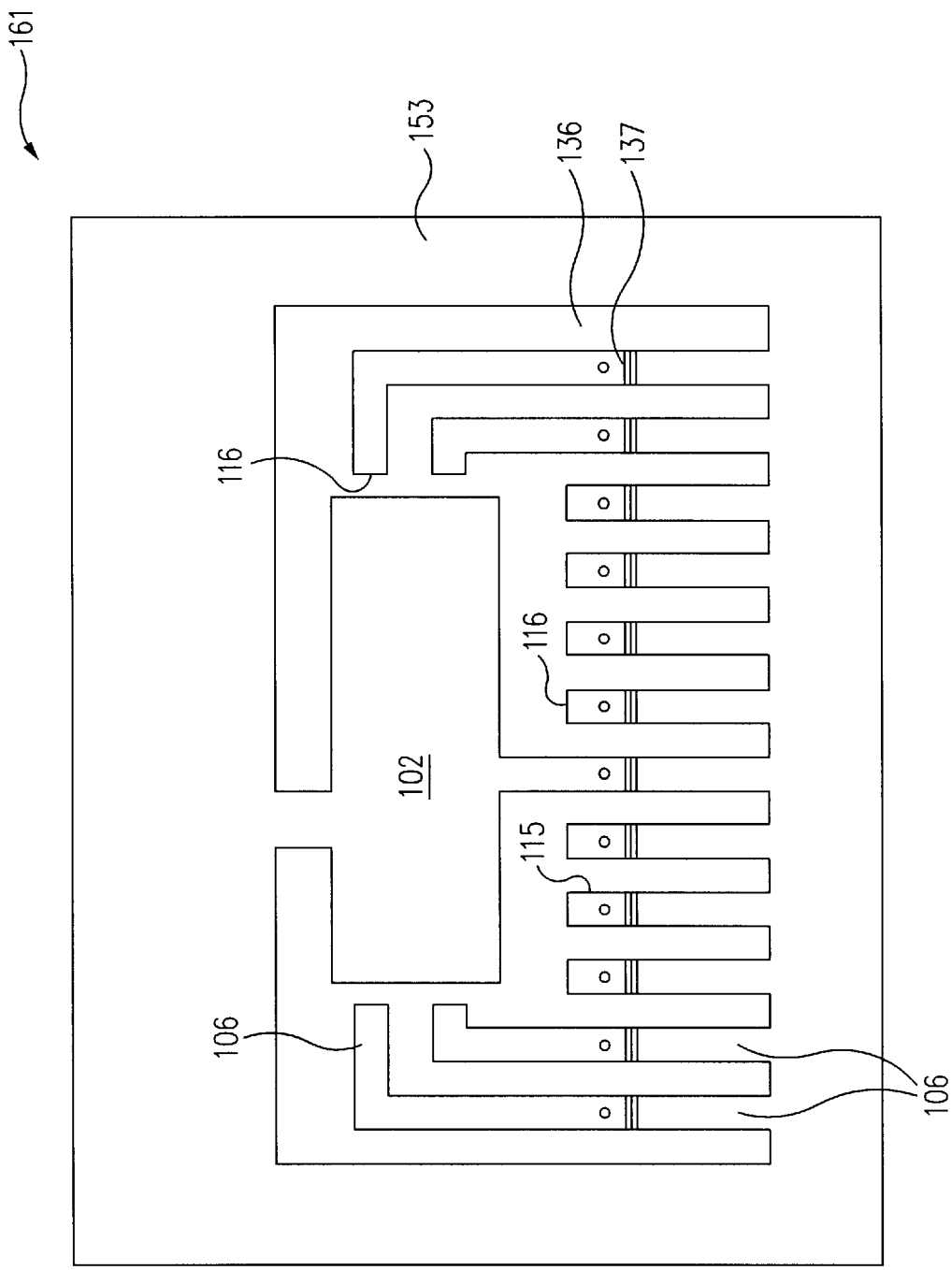
FIG. 15 is a top view of a leadframe.

The present invention also includes other embodiments having similarities to the above-mentioned structures and methods. For instance, FIG. 14 shows a smaller package 100A that is similar to the package 100 of FIG. 1, but omits the second integrated circuit chip 148 and die pads 142, 144 and the associated conductor 146. A lead frame 161 for making the package 100A is illustrated in FIG. 15. As shown in FIG. 15, the leads 106 of the leadframe 161, and hence of the resulting package 100A, have inner ends 116 adjacent to and facing three sides of the die pad 102 for electrical connection to the integrated circuit chip 104 (FIG. 14). Further, at least one of the leads 106 may be integrally connected to die pad 102, which can allow die pad 102 to be electrically connected to a ground or other bias voltage via the integral lead 106. Accordingly, the backside of the chip 104 may be biased with a ground or other voltage through die pad 102 and an electrically conductive die attach material.

In another alternative embodiment of a package shown in FIG. 12., the integrated circuit chips 104, 140 may be mounted on second surfaces 111, 151, 153 of the die pads 102, 142, and 144 respectively. In such a package, the, conductive elements 110 may be electrically connected to the fully encapsulated second surface 114 of the respective leads 106. The die pads 102, 142, and 144 could be set up in the body 120 to accommodate the apex of the conductive elements 110. In a further alternative embodiment, the aperture 130 has a depth equal to or greater than the length of the adjacent lead 106, and the conductive element 110 is coupled to the encapsulated second surface of the lead 106.

Figure 16:
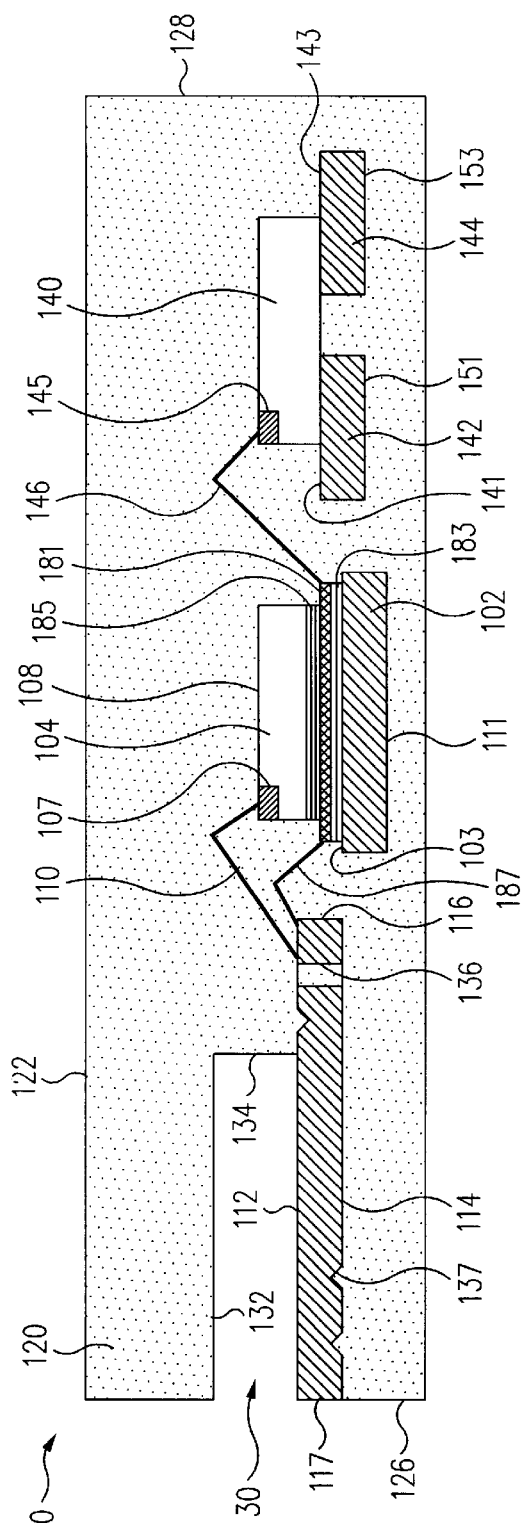
FIG. 16 is a cross-sectional side view of a package including a pair of integrated circuit chips.

In another exemplary embodiment, shown in FIG. 16, the die pad 102 may support a layer of conductive traces 181 (e.g., copper traces) on an insulative layer 183. The chip 104 may be adhered over the traces 181 with another insulative adhesive layer 185. Accordingly, the second chip 140 may be electrically connected by conductive elements 146 to an inner end of the traces 181. An outer end of the traces 181 may be electrically connected by other conductive elements 187 to the leads 106. Thus, the second integrated circuit 140 may also be connected to the leads 106 for external connection, separately or in parallel with the first integrated circuit chip 104.

Figure 17:
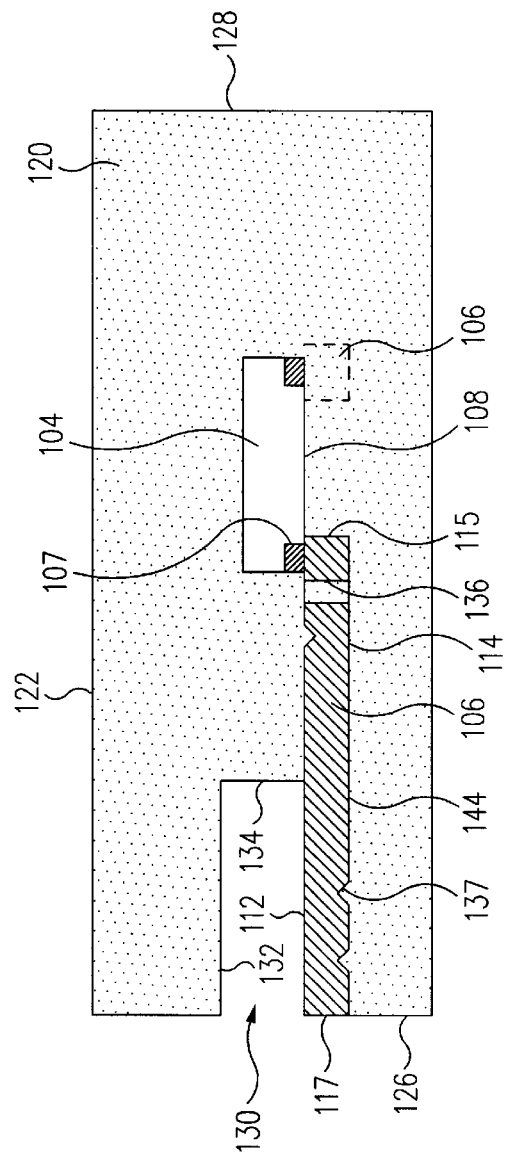
FIG. 17 is a cross-sectional side view of a package including an integrated circuit chip.

As another example, FIG. 17 shows that the die pad 102 of the package 100A of FIG. 15 may be omitted and the leads 106 of leadframe 161 of FIG. 115 extended so that the integrated circuit chip 104 may be mounted on the encapsulated inner end portion of the first surface 112 of the extended leads 106 in a flip chip configuration. The integrated circuit chip 104 may be flip chip mounted either on the first surface 112 of the leads 106 or on the second surface 114 of the leads 106.

Finally, any of the above embodiments can be changed to include a second chip 104 that is stacked on the original chip 104 and electrically connected in parallel to leads 106, as in a stacked memory. Alternatively, the second chip 104 can be electrically connected to the underlying chip 104.

The embodiments described above are merely examples of the present invention. Artisans may develop variations of these embodiments without departing from the spirit of the invention or the following claims.

What is claimed is:

1. A package comprising:
    a molded plastic body having a first integrated circuit chip disposed therein; and
    lead embedded in the molded plastic body and electrically coupled to the first integrated circuit, the lead having a first surface;
    a die pad encapsulated in the molded plastic body, the first integrated circuit chip being mounted on a first surface of the die pad,
    wherein the molded plastic body includes an open aperture adjacent the lead first surface, at least a portion of the lead first surface being exposed through the aperture to permit electrical connection to the first surface through the aperture.

2. The package of claim 1, further comprising:
    a plurality of the leads and a plurality of the open apertures, wherein each of the leads is electrically coupled to the first integrated circuit chip, and the first surface of each of the leads is exposed through an associated one of the apertures to permit electrical connection to the first surface through the associated aperture.

3. The package of claim 1, further comprising a second electronic device disposed within the package and electrically coupled to the first integrated circuit chip.

4. The package of claim 3, wherein the second electronic device is an integrated circuit chip.

5. The package of claim 1, wherein the aperture is tapered at an angle of about 1 to 3 degrees.

6. The package of claim 1, wherein the aperture further includes a longitudinal axis, the aperture longitudinal axis being parallel with the lead first surface.

7. The package of claim 1, wherein the lead is entirely within a perimeter of the molded plastic body.

8. The package of claim 1, wherein the molded plastic body has a rectangular prism shape.

9. The package of claim 1, wherein a portion of the lead first surface is encapsulated.

10. The package of claim 1, wherein the first integrated circuit chip is electrically coupled to the first surface of the lead.

11. The package of claim 1, wherein the first integrated circuit chip is electrically coupled to a portion of the first surface of the lead that is encapsulated.

12. The package of claim 1, wherein the first surface of the die pad has a same orientation as the first surface of the lead.

13. The package of claim 1, further comprising a second electronic device in the molded plastic body, wherein the second electronic device is electrically coupled to the lead.

14. The package of claim 1, wherein the lead has an encapsulated second surface opposite the first surface, and the first integrated circuit chip is electrically coupled to the second surface of the lead.

15. The package of claim 1, wherein the first integrated circuit chip is electrically coupled to the lead in a flip chip electrical connection.

16. The package of claim 1, wherein the first surface of the die pad has an opposite orientation as the first surface of the lead.

17. A package comprising:
    an integrated circuit chip electrically coupled to a plurality of metal leads, each said lead having a first surface; and a package body formed of a molded plastic encapsulant having a first surface, wherein the body includes a plurality of open apertures each associated with one of the leads, each aperture extending into the body through the first surface and parallel to a longitudinal axis of the associated lead, said aperture exposing the first surface of the associated lead.

18. The package of claim 17, wherein a severed surface of the leads is co-planar with the first surface of the package body.

19. The package of claim 17, wherein each said lead further comprises a second surface, each said lead including a through hole extending between the first and second surfaces of said lead.

20. The package of claim 17, further comprising a second electronic device disposed within the package body and electrically coupled to the first integrated circuit chip.

21. The package of claim 17, wherein the aperture is tapered at an angle of about 1 to 3 degrees.

22. The package of claim 17, wherein the aperture further includes a longitudinal axis, the aperture longitudinal axis being parallel with the lead first surface.

23. The package of claim 17, wherein the lead is entirely within a perimeter of the package body.

24. The package of claim 17, wherein the package body has a rectangular prism shape.

25. The package of claim 17, wherein a portion of the lead first surface is encapsulated.

26. The package of claim 17, wherein the first integrated circuit chip is electrically coupled to the first surface of the lead.

27. The package of claim 17, wherein the first integrated circuit chip is electrically coupled to a portion of the first surface of the lead that is encapsulated.

28. The package of claim 17, further comprising a die pad encapsulated in the package body, the first integrated circuit chip being mounted on a first surface of the die pad.

29. A package comprising:

a plurality of metal leads, each of the metal leads having a first surface and an opposing second surface;

an integrated circuit chip electrically coupled to the metal leads;

a package body having a first surface, wherein the body includes a plurality of open apertures each associated with one of the leads, each aperture extending into the body through the first surface of the package body adjacent the associated lead, said aperture exposing the first surface of the associated lead, the second surface of the associated lead being encapsulated within the package body, each of the leads being entirely within a perimeter of the package body.

30. The package of claim 29, wherein a portion of the lead first surface is encapsulated.

31. The package of claim 29, wherein the first integrated circuit chip is electrically coupled to a portion of the first surface of the lead that is encapsulated.

32. The package of claim 17, wherein the first integrated circuit chip is mounted on a die pad, and further comprising a means between the die pad and the first integrated circuit chip for electrically connecting the second electronic device to the leads.

33. The package of claim 17, wherein a short severed stub end of the leads extends outwardly beyond said first surface.

* * * * *